(12) United States Patent
Gerson et al.

(10) Patent No.: US 10,168,530 B2
(45) Date of Patent: *Jan. 1, 2019

(54) COUPLING SCHEMES FOR GIMBALED SCANNING MIRROR ARRAYS

(71) Applicant: APPLE INC., Cupertino, CA (US)

(72) Inventors: Yuval Gerson, Sunnyvale, CA (US); Naftali Chayat, Kfar Saba (IL); Noel Axelrod, Jerusalem (IL); Alexander Shpunt, Portola Valley, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/622,111

(22) Filed: Jun. 14, 2017

(65) Prior Publication Data

US 2017/0276931 A1 Sep. 28, 2017

Related U.S. Application Data

(60) Division of application No. 14/599,507, filed on Jan. 18, 2015, now Pat. No. 9,715,107, which is a
(Continued)

(51) Int. Cl.
*B81C 1/00* (2006.01)
*G01S 17/10* (2006.01)
(Continued)

(52) U.S. Cl.
CPC .......... *G02B 26/101* (2013.01); *B81C 1/0015* (2013.01); *G01S 7/4817* (2013.01);
(Continued)

(58) Field of Classification Search
CPC ... G02B 26/101; G02B 26/085; G01S 7/4817; G01S 17/42; G01S 17/10; G01S 17/89;
(Continued)

(56) References Cited

U.S. PATENT DOCUMENTS 5,608,468 A 3/1997 Gove
5,635,708 A 6/1997 Obata
(Continued)

FOREIGN PATENT DOCUMENTS

EP 1953583 A2 8/2008
JP 2012242477 A 12/2012

OTHER PUBLICATIONS

Yang et al. (Phase synchronization of micro-mirror arrays using elastic linkages, Sensors and Actuators A 95 {2001}, pp. 55-60).*
(Continued)

*Primary Examiner* — Kimberly N. Kakalec
(74) *Attorney, Agent, or Firm* — D. Kligler IP Services Ltd.

(57) ABSTRACT

A scanning device includes a substrate, which is etched to define an array of two or more parallel rotating members and a gimbal surrounding the rotating members. First hinges connect the gimbal to the substrate and defining a first axis of rotation, about which the gimbal rotates relative to the substrate. Second hinges connect the rotating members to the support and defining respective second, mutually-parallel axes of rotation of the rotating members relative to the support, which are not parallel to the first axis.

5 Claims, 5 Drawing Sheets

Related U.S. Application Data continuation-in-part of application No. 13/798,251, filed on Mar. 13, 2013, now Pat. No. 9,435,638.

(60) Provisional application No. 61/929,071, filed on Jan. 19, 2014, provisional application No. 61/614,018, filed on Mar. 22, 2012.

(51) Int. Cl.
| | | |
|---|---|---|
| *G01S 17/42* | (2006.01) | |
| *G01S 17/89* | (2006.01) | |
| *G01S 7/481* | (2006.01) | |
| *G02B 26/08* | (2006.01) | |
| *G02B 26/10* | (2006.01) | |

(52) U.S. Cl.
CPC .............. *G01S 17/10* (2013.01); *G01S 17/42* (2013.01); *G02B 26/085* (2013.01); *B81B 2201/04* (2013.01); *B81C 2201/013* (2013.01); *G01S 17/89* (2013.01)

(58) Field of Classification Search
CPC ............ B81C 1/0015; B81C 2201/013; B81B 2201/04
See application file for complete search history.

(56) References Cited

U.S. PATENT DOCUMENTS

| | | | | |
|---|---|---|---|---|
| 5,847,859 | A | * | 12/1998 | Murata ................ G02B 26/085 235/462.35 |
| 6,540,361 | B1 | | 4/2003 | Hayashi et al. |
| 9,462,255 | B1 | | 10/2016 | Marason et al. |
| 9,835,853 | B1 | * | 12/2017 | Shpunt ................ G02B 26/105 |
| 2004/0081391 | A1 | * | 4/2004 | Ko ........................ B81B 3/0062 385/18 |
| 2005/0046504 | A1 | * | 3/2005 | Xiaoyu .............. G02B 26/0841 331/154 |
| 2005/0078169 | A1 | * | 4/2005 | Tumer .................... B41J 2/471 347/260 |
| 2008/0278785 | A1 | | 11/2008 | Klose et al. |
| 2010/0046052 | A1 | * | 2/2010 | Mizoguchi ........... G02B 26/101 359/199.3 |
| 2014/0078514 | A1 | | 3/2014 | Zhu |
| 2017/0097407 | A1 | * | 4/2017 | Shpunt .................. G01S 7/4817 |

OTHER PUBLICATIONS

International Application # PCT/US2017/039165 Search Report dated Oct. 4, 2017.
CN Application # 201580005002.2 office action dated Jun. 12, 2018.
U.S. Appl. No. 15/385,883 office action dated Jul. 11, 2018.

* cited by examiner

COUPLING SCHEMES FOR GIMBALED SCANNING MIRROR ARRAYS

CROSS-REFERENCE TO RELATED APPLICATION

This patent application is a division of U.S. patent application Ser. No. 14/599,507, filed Jan. 18, 2015, which is a continuation-in-part of U.S. patent application Ser. No. 13/798,251, filed Mar. 13, 2013 (now U.S. Pat. No. 9,435,638), which claims the benefit of U.S. Provisional Patent Application 61/614,018, filed Mar. 22, 2012. U.S. patent application Ser. No. 14/599,507 also claims the benefit of U.S. Provisional Patent Application 61/929,071, filed Jan. 19, 2014. The disclosures of these related applications are incorporated herein by reference.

FIELD OF THE INVENTION

The present invention relates generally to micro-mechanical systems, and particularly to optical scanning using such systems.

BACKGROUND

Various methods are known in the art for optical 3D mapping, i.e., generating a 3D profile of the surface of an object by processing an optical image of the object. This sort of 3D profile is also referred to as a 3D map, depth map or depth image, and 3D mapping is also referred to as depth mapping.

PCT International Publication WO 2012/020380, whose disclosure is incorporated herein by reference, describes apparatus for mapping, which includes an illumination module. This module includes a radiation source, which is configured to emit a beam of radiation, and a scanner, which is configured to receive and scan the beam over a selected angular range. Illumination optics are configured to project the scanned beam so as to create a pattern of spots extending over a region of interest. An imaging module is configured to capture an image of the pattern that is projected onto an object in the region of interest. A processor is configured to process the image in order to construct a three-dimensional (3D) map of the object.

U.S. Patent Application Publication 2011/0279648, whose disclosure is incorporated herein by reference, describes a method for constructing a 3D representation of a subject, which comprises capturing, with a camera, a 2D image of the subject. The method further comprises scanning a modulated illumination beam over the subject to illuminate, one at a time, a plurality of target regions of the subject, and measuring a modulation aspect of light from the illumination beam reflected from each of the target regions. A moving-mirror beam scanner is used to scan the illumination beam, and a photodetector is used to measure the modulation aspect. The method further comprises computing a depth aspect based on the modulation aspect measured for each of the target regions, and associating the depth aspect with a corresponding pixel of the 2D image.

U.S. Pat. No. 8,018,579, whose disclosure is incorporated herein by reference, describes a three-dimensional imaging and display system in which user input is optically detected in an imaging volume by measuring the path length of an amplitude modulated scanning beam as a function of the phase shift thereof. Visual image user feedback concerning the detected user input is presented.

U.S. Pat. No. 7,952,781, whose disclosure is incorporated herein by reference, describes a method of scanning a light beam and a method of manufacturing a microelectromechanical system (MEMS), which can be incorporated in a scanning device.

U.S. Patent Application Publication 2013/0207970, whose disclosure is incorporated herein by reference, describes a scanning depth engine, which includes a transmitter, which emits a beam comprising pulses of light, and a scanner, which is configured to scan the beam, within a predefined scan range, over a scene. The scanner may comprise a micromirror produced using microelectromechanical system (MEMS) technology. A receiver receives the light reflected from the scene and generates an output indicative of the time of flight of the pulses to and from points in the scene. A processor is coupled to control the scanner and to process the output of the receiver so as to generate a 3D map of the scene.

Another time-of-flight scanner using MEMS technology is the Lamda scanner module produced by the Fraunhofer Institute for Photonic Microsystems IPMS (Dresden, Germany). The Lamda module is constructed based on a segmented MEMS scanner device consisting of identical scanning mirror elements. A single scanning mirror of the collimated transmit beam oscillates parallel to a segmented scanning mirror device of the receiver optics.

SUMMARY

Embodiments of the present invention that are described hereinbelow provide improved scanning devices, as well as apparatus and methods for 3D mapping using such devices.

There is therefore provided, in accordance with an embodiment of the present invention, a scanning device, including a substrate, which is etched to define an array of two or more parallel rotating members and a gimbal surrounding the rotating members. First hinges connect the gimbal to the substrate and define a first axis of rotation, about which the gimbal rotates relative to the substrate. Second hinges connect the rotating members to the gimbal and define respective second, mutually-parallel axes of rotation of the rotating members relative to the gimbal, which are not parallel to the first axis.

In some embodiments, the gimbal is configured to couple together the two or more parallel rotating members with a coupling strength sufficient to synchronize an oscillation of the rotating members about the respective second axes. Typically, the rotating members, gimbal and hinges are etched so as to define a mode of the oscillation having a quality factor Q, such the quality factor Q and the coupling strength $\gamma$ satisfy the relation: $1/Q \ll |\gamma| \ll 1$, wherein the mode of oscillation is defined so that $\gamma > 0$, and the rotating members rotate in phase about the respective second axes.

Additionally or alternatively, the device includes coupling means connected to the rotating members so as to synchronize an oscillation of the rotating members about the respective second axes. In one embodiment, the coupling means are configured to synchronize the oscillation of the rotating members by exerting an electromagnetic force between the rotating members. The coupling means can include permanent magnets, which are fixed to the rotating members. In another embodiment, the coupling means include a belt, which is etched from the substrate and has first and second ends attached respectively to first and second ones of the rotating members so as to synchronize an oscillation of the rotating members about the respective second axes.

In the disclosed embodiments, the rotating members include plates, and the device includes a reflective coating applied to the substrate on the plates, whereby the plates function as micromirrors.

Typically, the substrate is a part of a silicon wafer.

In some embodiments, the apparatus includes an electromagnetic drive, which is coupled to drive the gimbal and the rotating members to rotate respectively about the first and second axes.

There is also provided, in accordance with an embodiment of the present invention, a scanning device, including a substrate, which is etched to define an array of two or more parallel rotating members, a support surrounding the rotating members, and respective hinges connecting the rotating members to the support, thereby defining respective parallel axes of rotation of the rotating members relative to the support. Coupling means are connected to the rotating members so as to synchronize an oscillation of the rotating members about the respective axes.

In one embodiment, the coupling means include a belt, which is etched from the substrate and has first and second ends attached respectively to first and second ones of the rotating members.

In another embodiment, the coupling means are configured to synchronize the oscillation of the rotating members by exerting an electromagnetic force between the rotating members. The coupling means can include permanent magnets, which are fixed to the rotating members.

The coupling means may be configured to cause the rotating members to oscillate in phase, so that the rotating members have the same angular orientation during oscillation, or so as to cause the rotating members to oscillate in anti-phase.

There is additionally provided, in accordance with an embodiment of the present invention, a method for producing a scanning device. The method includes etching a substrate so as to define an array of two or more parallel rotating members, a support surrounding the rotating members, and respective hinges connecting the rotating members to the support, thereby defining respective parallel axes of rotation of the rotating members relative to the support. A coupling force is applied to the rotating members so as to synchronize an oscillation of the rotating members about the respective axes.

There is further provided, in accordance with an embodiment of the present invention, a method for producing a scanning device. The method includes etching a substrate so as to define an array of two or more parallel rotating members, a gimbal surrounding the rotating members, and first hinges, connecting the gimbal to the substrate and defining a first axis of rotation, about which the gimbal rotates relative to the substrate. Second hinges are etched, connecting the rotating members to the gimbal and defining respective second, mutually-parallel axes of rotation of the rotating members relative to the gimbal, which are not parallel to the first axis.

There is moreover provided, in accordance with an embodiment of the present invention, a method for scanning, which includes providing a substrate, which is etched to define an array of two or more parallel micromirrors and a gimbal surrounding the micromirrors. The micromirrors are driven to rotate about respective parallel first axes of rotation relative to the gimbal while driving the gimbal to rotate about a second axis relative to the substrate. A coupling force is applied to the micromirrors so as to synchronize an oscillation of the micromirrors about the respective axes. A beam of light is directed toward the micromirror array while the micromirrors and the gimbal rotate, so as to cause the micromirrors to scan the beam over a scene.

In a disclosed embodiment, directing the beam includes directing pulses of the light toward the micromirror array, and the method includes receiving, by reflection from the micromirror array, the light reflected from the scene and generating an output indicative of a time of flight of the pulses to and from points in the scene. The output during a scan of the beam is processed so as to generate a three-dimensional map of the scene.

In some embodiments, the substrate is etched to define respective first hinges connecting the micromirrors to the gimbal, thereby defining the respective parallel first axes of rotation of the micromirrors relative to the gimbal. One or more flexible coupling members are connected to the micromirrors so as to synchronize an oscillation of the micromirrors about the respective first axes, and second hinges connecting the gimbal to the substrate along the second axis.

In a disclosed embodiment, driving the mirrors includes applying a current to an electromagnetic drive, which is coupled to the micromirror array, so as to cause the micromirrors to rotate about the first axes at a first frequency, which is a resonant frequency of rotation, while causing the gimbal to rotate about the second axis at a second frequency, which is lower than the first frequency.

In one embodiment, applying the coupling force includes etching the substrate so as to define one or more flexible coupling members, connected between the micromirrors. In another embodiment, applying the coupling force includes causing an electromagnetic force to be exerted between the micromirrors. Additionally or alternatively, the substrate is etched so that the gimbal applies the coupling force to the micromirrors with a coupling strength sufficient to synchronize the oscillation.

There is furthermore provided, in accordance with an embodiment of the present invention, a scanning device, which includes a substrate, which is etched to define an array of two or more parallel rotating members, a support surrounding the rotating members, and respective hinges connecting the rotating members to the support, thereby defining respective parallel axes of rotation of the rotating members relative to the support. Coupling means are connected to the rotating members and configured to exert an electromagnetic force between the rotating members so as to synchronize an oscillation of the rotating members about the respective axes.

In one embodiment, the coupling means include permanent magnets, which are fixed to the rotating members.

The present invention will be more fully understood from the following detailed description of the embodiments thereof, taken together with the drawings in which:

DETAILED DESCRIPTION OF EMBODIMENTS

Figure 1:
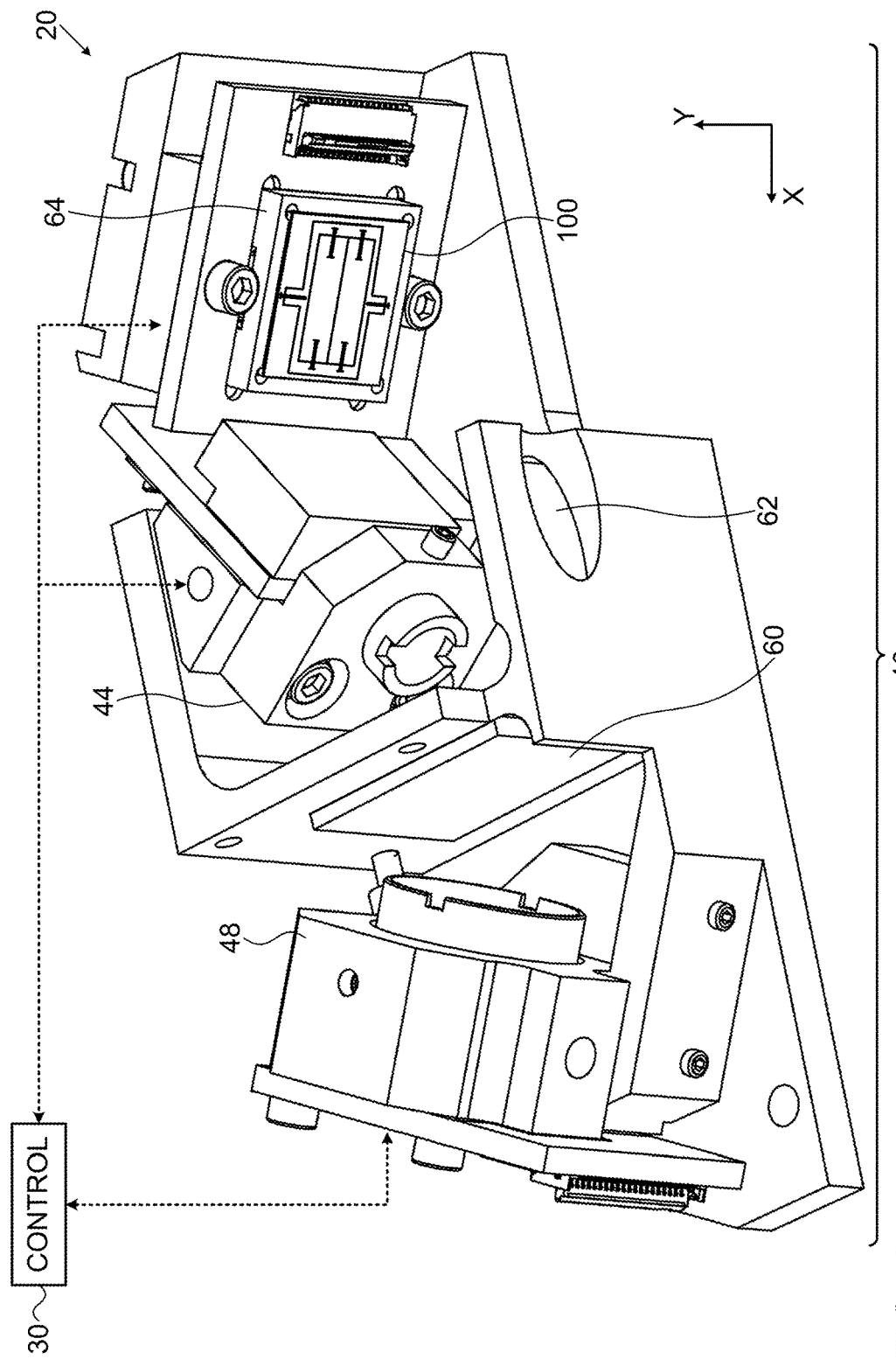
FIG. 1 is a schematic, pictorial illustration of an optical scanning head, in accordance with an embodiment of the present invention.

The above-mentioned U.S. Patent Application Publication 2013/0207970 describes depth engines that generate 3D mapping data by measuring the time of flight of a scanning beam. A light transmitter, such as a laser, directs short pulses of light toward a scanning mirror, which scans the light beam over a scene of interest. A receiver, such as a sensitive, high-speed photodiode (for example, an avalanche photodiode) receives light returned from the scene via the same scanning mirror. Processing circuitry measures the time delay between the transmitted and received light pulses at each point in the scan. This delay is indicative of the distance traveled by the light beam, and hence of the depth of the object at the point. The processing circuitry uses the depth data thus extracted in producing a 3D map of the scene.

For compactness, low cost, and low power consumption, the scanning mirror in this sort of scanning system may be produced using MEMS technology (possibly by means of the sorts of techniques that are described in the above-mentioned U.S. Pat. No. 7,952,781). To enhance the sensitivity of the system, it is advantageous that the mirror be as large as possible (typically with an active area in the range of 5-25 $mm^2$). At the same time, for 3D mapping, as well as other scanning applications, it is desirable that the mirror scan mechanically about at least one axis over large angles (typically ±10-25°) at high frequency (typically 2-25 kHz). (The scan range about the second scan axis may be even larger, but the scan frequency is typically lower.) The need for high scan frequency and range conflicts with the desire to increase mirror size, and it may be infeasible to make a single scanning mirror of the desired size, range, and frequency capabilities given the limitations of the material (such as a silicon wafer) from which the scanner is made.

Some embodiments of the present invention that are described herein seek to overcome these design constraints by using an array of multiple, adjacent mirrors. The mirrors scan in mutual synchronization, and thus behave optically as though they were a single mirror, of dimensions equal to the size of the entire array. Coupling means between the mirrors in the array couple the oscillations of the mirrors and thus maintain the synchronization between them. The coupling means may comprise any suitable sort of link, such as mechanical coupling between the mirrors, or a link exerted by electromagnetic force, which may operate without mechanical contact between the mirrors. Typically, it is sufficient that the coupling means exert a weak coupling force in order to engender the desired synchronization, particularly when the mirrors are driven to scan at or near their resonant frequencies of rotation.

Alternatively, one of the mirrors may be used to reflect and scan the transmitted beam, while the other mirror (or two or more mirrors, in a larger array) reflects the light received from the scene toward the receiver. In this manner, separate transmit and receive mirrors may be synchronized, as described, for example, in U.S. patent application Ser. No. 14/554,086, filed Nov. 26, 2014, whose disclosure is incorporated herein by reference.

In the embodiments described below, the mirrors are mounted together in a gimbal, which is etched from the same substrate (such as a semiconductor wafer) as the mirrors themselves. The gimbal is connected to the substrate by hinges, which define a first axis of rotation, about which the gimbal rotates relative to the substrate. The mirrors are connected to the gimbal by second hinges, which define respective second, mutually-parallel axes of rotation of the mirrors relative to the gimbal. Typically, the second axes are perpendicular (or otherwise non-parallel) to the first axis. Thus, a miniature gimbaled array of mirrors may be produced, for example, in a MEMS process. This sort of gimbaled array structure may be applied not only to mirrors, but also to other types of rotating members, such as micromechanical rotating elements.

In some of the disclosed embodiments, the gimbal itself is configured to couple together the two or more parallel rotating members, with a coupling strength sufficient to synchronize the oscillation of the mirrors about the respective axes. For this purpose, the gimbal is typically designed to have sufficient flexibility and appropriate mechanical characteristics to define a system oscillation mode and resonant frequency, with a quality factor and coupling strength high enough to induce the desired synchronization of the rotating members. The particular properties and design criteria of such a gimbal are explained in detail hereinbelow.

In most of the embodiments that are illustrated in the figures, the synchronized mirror array comprises two micromirrors, which operate in phase and are mounted on a gimbaled base for two-axis scanning. (The term "micromirror" is used herein simply to refer to very small mirrors, which are typically no more than a few millimeters across, although it may be possible to apply certain principles of the present invention to larger mirrors.) Alternatively, such mirror arrays may comprise a larger number of mirrors, and may be deployed with or without gimbaling. Further alternatively or additionally, other forms of synchronization, such as anti-phased rotation of the mirrors in the array, can be implemented by appropriate design of the mirrors and the coupling between them.

Although the embodiments described below relate, for the sake of clarity and completeness, specifically to micromirrors, the principles of these embodiments may similarly to applied, mutatis mutandis, to other sorts of micro-mechanical rotating members that are produced and configured in accordance with these principles. In the disclosed embodiments, these rotating members have the form of plates etched from a substrate, to which a reflective coating is applied in order to create the micromirrors. Synchronization of rotating members having other shapes and forms by means of the techniques described herein, however, is also within the scope of the present invention.

FIG. 1 schematically illustrates elements of an optical scanning head 40 comprising a gimbaled micromirror array 100, in accordance with an embodiment of the present invention. With the exception of the micromirror array itself, optical scanning head 40 is similar to the optical scanning head that is described in the above-mentioned U.S. Patent Application Publication 2013/0207970. A transmitter 44 emits pulses of light toward a polarizing beamsplitter 60. Typically, only a small area of the beamsplitter, directly in the light path of transmitter 44, is coated for reflection, while the remainder of the beamsplitter is fully transparent in the transmitted wavelength range (or even anti-reflection coated for it) to permit returned light to pass through to a receiver 48. The light from transmitter 44 reflects off beamsplitter 60 and then a folding mirror 62 toward micromirror array 100. A MEMS scanner 64 scans the micromirror array in X- and Y-directions with the desired scan frequency and amplitude. Details of the micromirror array and scanner are shown in the figures that follow.

Light pulses returned from the scene strike micromirror array 100, which reflects the light via folding mirror 62 through beamsplitter 60. To limit the amount of unwanted ambient light that reaches receiver 48, a bandpass filter (not shown) may be incorporated in the receiver path, possibly on the same substrate as beamsplitter 60. Receiver 48 senses the returned light pulses and generates corresponding electrical pulses. A controller 30 drives transmitter 44 and scanner 64 and analyzes the time delay between the transmitted pulses and the corresponding pulses from receiver 48 in order to measure the time of flight of each pulse. Based on this time of flight, the controller computes the depth coordinate of each point in the scene that is scanned by scanning head 40 and thus generates a depth map of the scene.

To enhance sensitivity of detection, the overall area of beamsplitter 60 and the aperture of receiver 48 are considerably larger than the area of the transmitted beam. It is also desirable that the micromirrors in micromirror array 100 be as large as possible, within the inertial constraints imposed by the scanner. For example, the area of each micromirror may be about 5-15 mm$^2$, and the overall area of the micromirror array may be about 10-30 mm$^2$.

The specific mechanical and optical designs of the optical head shown in FIG. 1 are described here by way of example, and alternative designs implementing similar principles are considered to be within the scope of the present invention. As noted earlier, in some alternative designs, different micromirrors in array 100 may be used for transmission and for reception.

Figure 2:
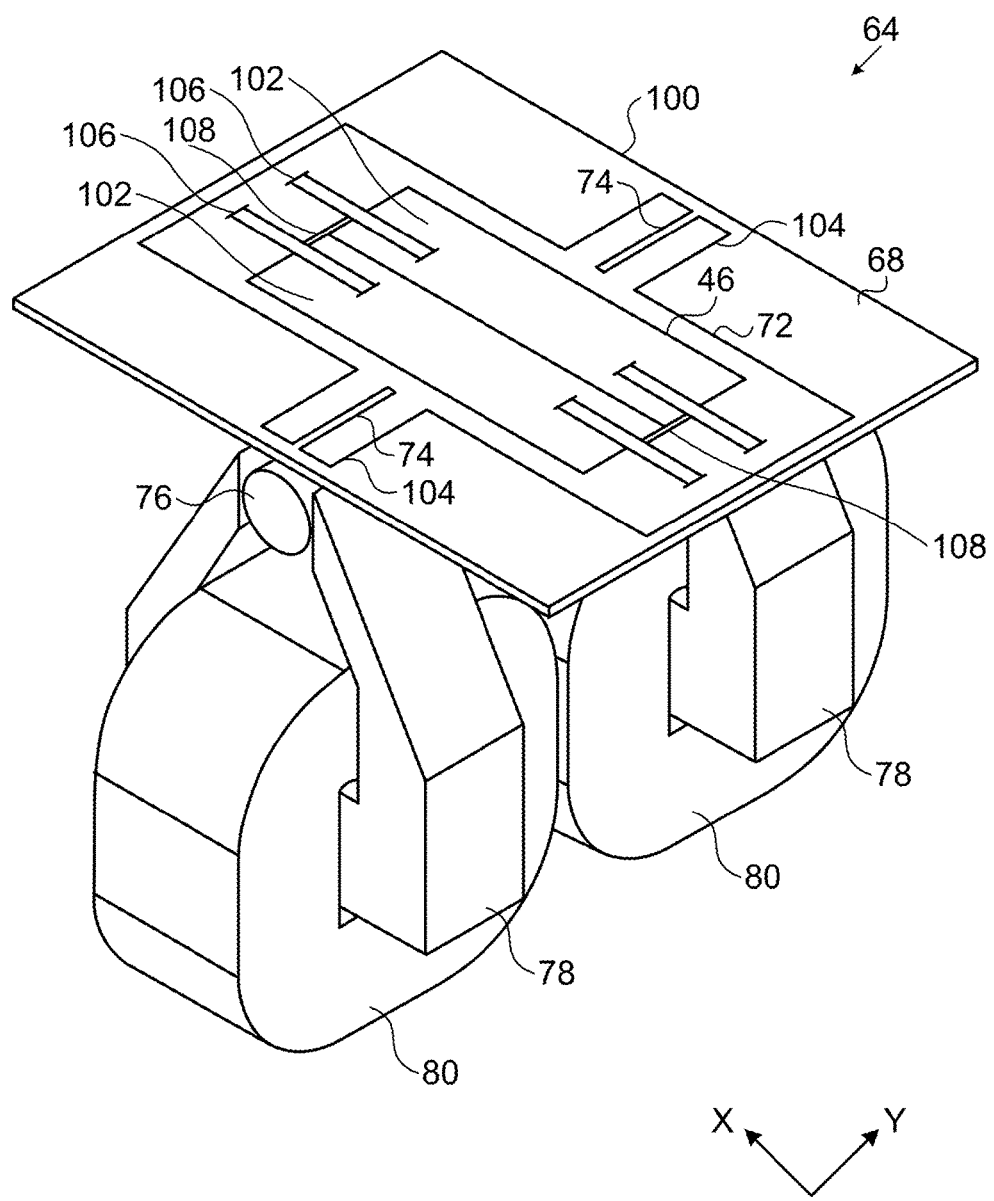
FIG. 2 is a schematic, pictorial illustration of a MEMS scanner, in accordance with an embodiment of the present invention.

FIG. 2 is a schematic, pictorial illustration of MEMS scanner 64, in accordance with an embodiment of the present invention. This scanner is produced and operates on principles similar to those described in the above-mentioned U.S. Pat. No. 7,952,781, but enables two-dimensional scanning of micromirror array 100. The micromirror array is produced by suitably etching a semiconductor substrate 68 to separate micromirrors 102 in the array from a support 72, and to separate the support from the remaining substrate 68. After etching, micromirrors 102 (to which a suitable reflective coating is applied) are able to rotate in the Y-direction relative to support 72 on hinges 106, while support 72 rotates in the X-direction relative to substrate 68 on hinges 74, which are coupled to wings 104 of support 72. (Such hinges may also be referred to as spindles or pivots.)

When support 72 is itself capable of rotating, such as in the manner described above, the support is also referred to as a gimbal. The terms "support" and "gimbal," however, as used in the present description and in the claims, are not entirely interchangeable: Aspects of the embodiments described herein may be applied to arrays of rotating elements, such as micromirrors 102, that are mounted in a non-rotating support. Other aspects of the present embodiments may be applied to gimbaled arrays of rotating elements in which the gimbal itself, or at least certain elements of the gimbal, is not necessarily etched from the same substrate as the rotating elements.

Micromirrors 102 and support 72 are mounted on a pair of rotors 76, which typically comprise permanent magnets. (Only one of the rotors is visible in this figure.) Rotors 76 are suspended in respective air gaps of magnetic cores 78. Cores 78 are wound with respective coils 80 of conductive wire, thus creating an electromagnetic stator assembly. Although a single coil per core is shown in FIG. 2 for the sake of simplicity, two or more coils may alternatively be wound on each core; coils may be wound at different places on the cores; and different core shapes may also be used. Alternative core and coil designs are shown, for example, in PCT Patent Application PCT/IB2013/056101, filed Jul. 25, 2013, which is incorporated herein by reference.

Driving an electrical current through coils 80 generates a magnetic field in the air gaps, which interacts with the magnetization of rotors 76 so as to cause the rotors to rotate or otherwise move within the air gaps. Specifically, coils 80 are driven with high-frequency differential currents so as to cause micromirror 46 to rotate resonantly back and forth about hinges 70 at high frequency (typically in the range of 2-kHz, as noted above). This resonant rotation generates the high-speed Y-direction raster scan of the output beam from engine 22. At the same time, coils 80 are driven together at lower frequency to drive the X-direction scan by rotation of support 72 about hinges 74 through the desired scan range. Alternatively, other stator configurations and drive schemes may be used for these purposes, as described in the above-mentioned PCT Patent Application PCT/IB2013/056101, for example. The X- and Y-rotations together generate the overall raster scan pattern of micromirror 46.

Assembly of optical head 40 from discrete optical and mechanical components, as shown in FIG. 1, requires precise alignment and can be costly. In alternative embodiments, all parts requiring precise placement and alignment (such as the light transmitter, receiver, and associated optics) may be combined in a single integrated package on a silicon optical bench (SiOB). This approach can save costs and may make the depth engine easier to handle. Various alternative designs of these sorts are shown in the above-mentioned U.S. Patent Application Publication 2013/0207970, and may be adapted, as well, for use with a micromirror array.

Additionally or alternatively, as noted above, the optical head may be configured with separate transmit and receive channels, as described, for example, in the above-mentioned U.S. patent application Ser. No. 14/554,086. In this case, one of micromirrors 102 is used to reflect and scan the beam output by transmitter 44, while the other micromirror (or two or more micromirrors, in a larger array) reflects the light received from the scene toward receiver 48.

The principles of the present invention may similarly be implemented, mutatis mutandis, in scanners of other sorts, including scanners based on other MEMS designs and other types of drives. For example, the micromirror and actuators described by Hah et al., in "Theory and Experiments of Angular Vertical Comb-Drive Actuators for Scanning Micromirrors," *IEEE Journal of Selected Topics in Quantum Electronics* 10:3 (May/June, 2004), pages 505-513, may be modified to operate in the context of a micromirror array.

Figure 3:
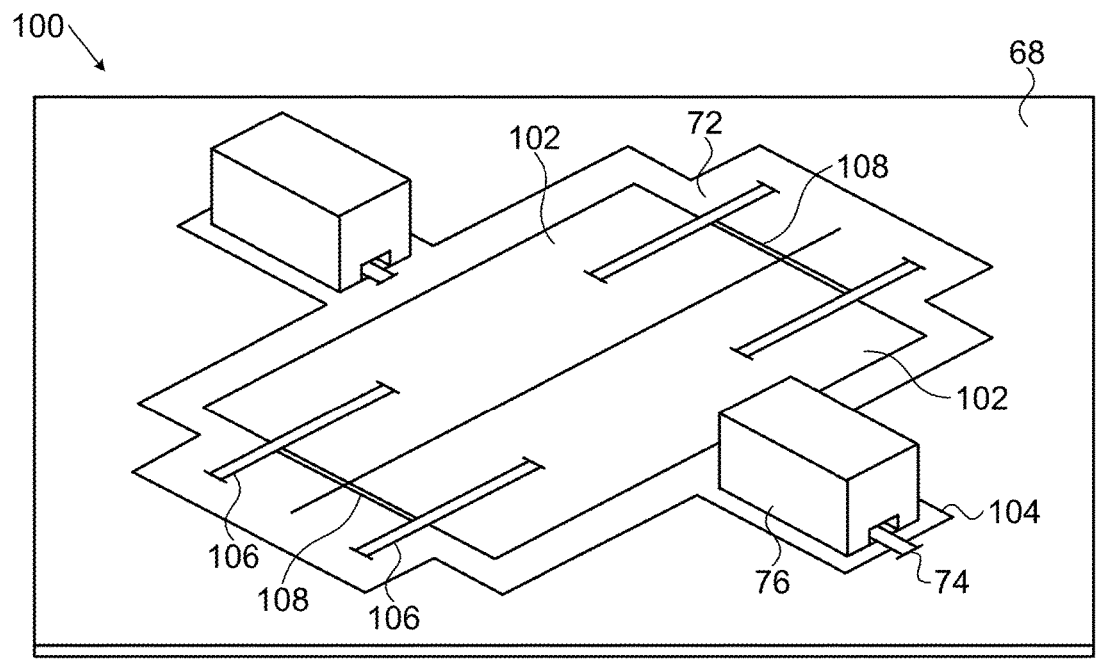
FIG. 3 is a schematic rear view of a gimbaled micromirror array, in accordance with an embodiment of the invention.

FIG. 3 is a schematic rear view of gimbaled micromirror array 100, in accordance with an embodiment of the invention. Array 100 as pictured in FIG. 3 differs in some details of shape and orientation from the micromirror array that is show in FIGS. 1 and 2, but its elements and principles of operation are the same. As noted earlier, array 100 comprises two parallel micromirrors 102, which are connected to support 72 by respective hinges 106. Magnetic rotors 76 are attached to wings 104 of support 72, which are coupled to substrate 68 by hinges 74, perpendicular to hinges 106. In operation, rotors 76 are suspended within the air gaps of cores 78, as shown in FIG. 2 and explained above. Micromirrors 102 are linked mechanically to one another by coupling means, comprising flexible coupling members in the form of belts 108, as explained below.

Figure 4:
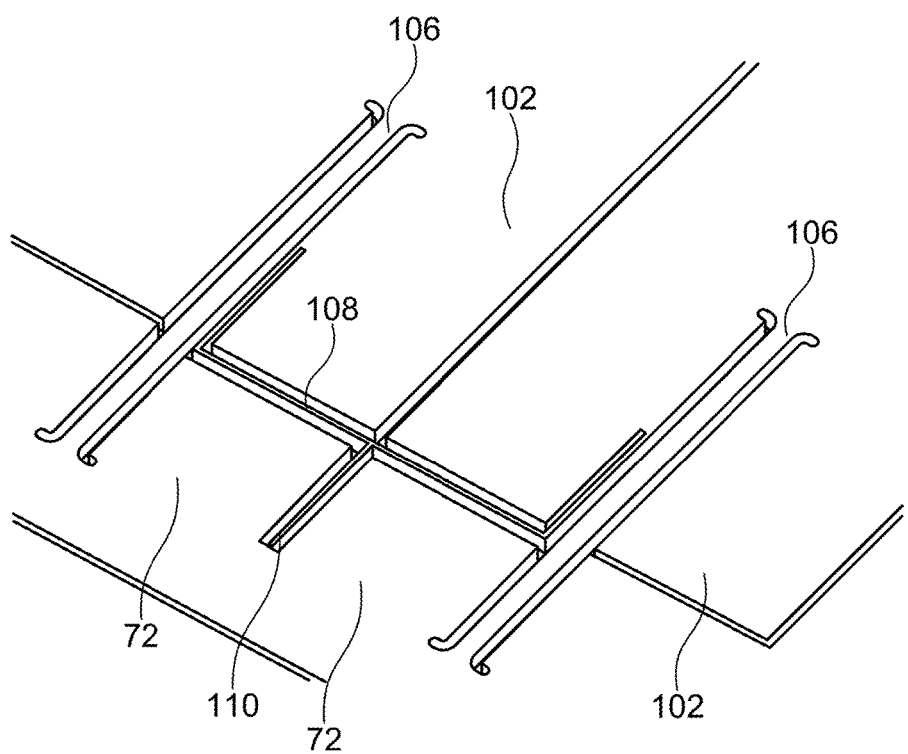
FIG. 4 is a schematic detail view showing elements of the micromirror array of FIG. 3.
Figure 5:
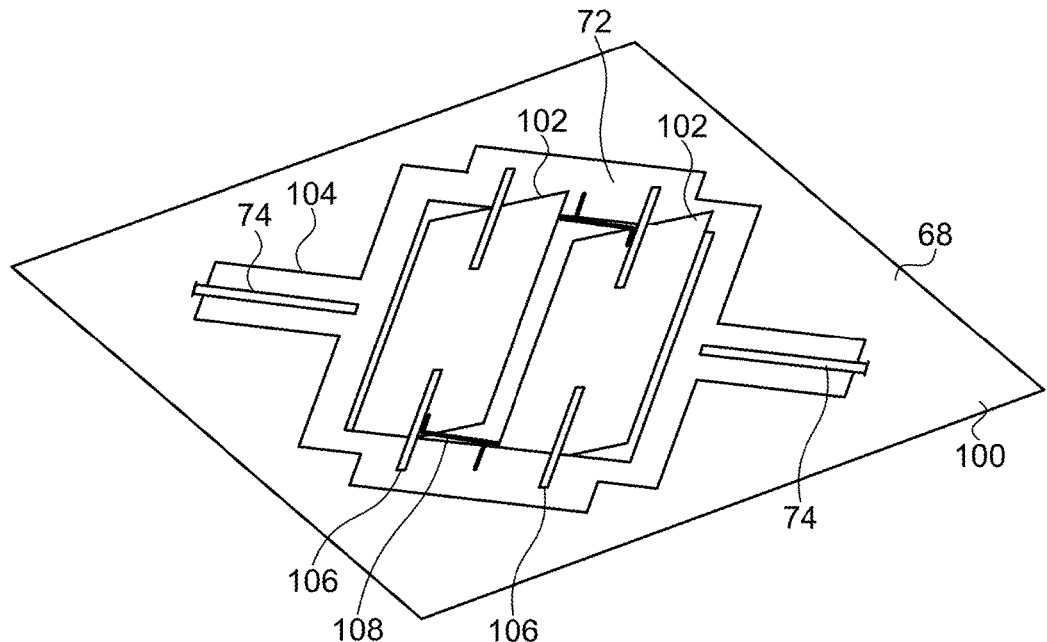
FIG. 5 is a schematic front view of the micromirror array of FIG. 3 in operation.

FIG. 4 is an enlarged, detail view of micromirrors 102, showing details of one of belts 108. This belt is produced in the same photolithographic process in which the mirrors and their hinges are etched apart from substrate 68. Belt 108 thus comprises a thin strip of silicon, typically about 10-100 µm wide, which is separated by grooves etched through the substrate from support 72 on one side and from micromirrors 102 on the other. The thickness of the belt (i.e., the dimension perpendicular to the wafer surface) may be the full thickness of the wafer. Alternatively, belt 108 may be thinned to alter the belt connection stiffness and to enable bending and stretching modes of the belt in addition to the torsion mode that is illustrated in FIG. 5. Each end of belt 108 is connected to a respective one of the micromirrors. Optionally the belt may be anchored to support 72 at a central pivot point 110.

In the embodiment illustrated in FIGS. 4 and 5, belt 108 runs directly between micromirrors 102 in a direction perpendicular to hinges 106. In other embodiments, belts and other coupling means may be attached at different points and/or run in different directions relative to the micromirrors and the hinges. For example, the ends of the belts may be attached to the hinges themselves, rather than to the micromirrors as shown in FIG. 4. Additionally or alternatively, the belts may turn to run within the space between the micromirrors, in an S- or X-configuration. Although these alternative configurations are not drawn in detail in the figures, they will be apparent to those skilled in the art after reading the present description and are considered to be within the scope of the present invention.

FIG. 5 is a schematic pictorial view of array 100 in operation, powered by a MEMS scanner as shown above. The MEMS scanner drives both micromirrors 102 to rotate simultaneously about the X-axis (as defined in FIG. 2). The elastic force exerted by belts 108 couples the motion of the two micromirrors together, so that they rotate in perfect phase synchronization and have the same angular orientation during oscillation. Even if the actual force exerted by the belts is small, it is sufficient to maintain mechanical phase locking and thus synchronize the two adjacent oscillators (i.e., the micromirrors), which have approximately the same resonant frequency. Thus, array 100 behaves optically as though it were a single oscillating mirror, with dimensions equal to the combined dimensions of both micromirrors 102 together.

Physically speaking, hinges 106 act as torsion springs, and belt 108 adds a third spring to the system, coupling together the masses of micromirrors 102. When the masses are coupled via this third spring, two modes of motion are possible: one in which, the masses move in the same direction, and the other in which the masses move in opposite directions. (Each mode has its own frequency, which is shared by both mirrors, as opposed to the individual frequencies of the two mirrors in the absence of a coupling member.) The stiffness of the third spring can be adjusted, even to the point at which belt 108 is the primary spring, exerting greater force than hinges 106.

Figure 6:
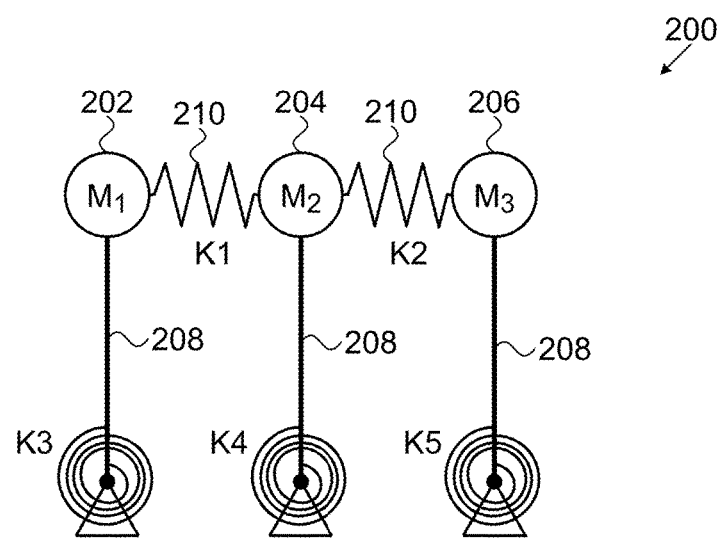
FIG. 6 is a schematic diagram illustrating principles of operation of a gimbaled micromirror array, in accordance with an embodiment of the present invention.

FIG. 6 is a schematic diagram illustrating principles of operation of a gimbaled micromirror array 200, in accordance with an embodiment of the present invention. This figure illustrates how the principles described above may be extended to arrays of three micromirrors 202, 204, 206 (labeled M1, M2 and M3), or more. Mirrors M1, M2 and M3 are mounted on pivots 208 (such as the sort of hinges described above), represented as springs K3, K4, K5. As explained above, either the mirrors M1, M2 and M3 or the springs K3, K4 and K5 (or both) are linked by coupling means 210, represented as springs K1 and K2. This arrangement can be used to synchronize the rotation of the three mirrors in the same manner as in the two-mirror embodiments described above. The three (or more) mirrors may likewise be mounted together on a gimbaled support.

Regardless of whether the array includes two, three, or more mirrors, the springs may be implemented either as the sort of pivots and belts that are shown in the preceding figures or using other sorts of coupling means, which may be fabricated by any suitable technique that is known in the art. Such coupling means may include, for example, flexible, elastic mechanical elements, such as belts 108 or components of the gimbal itself. Alternatively or additionally, the coupling means may comprise electromagnetic components.

Figure 7:
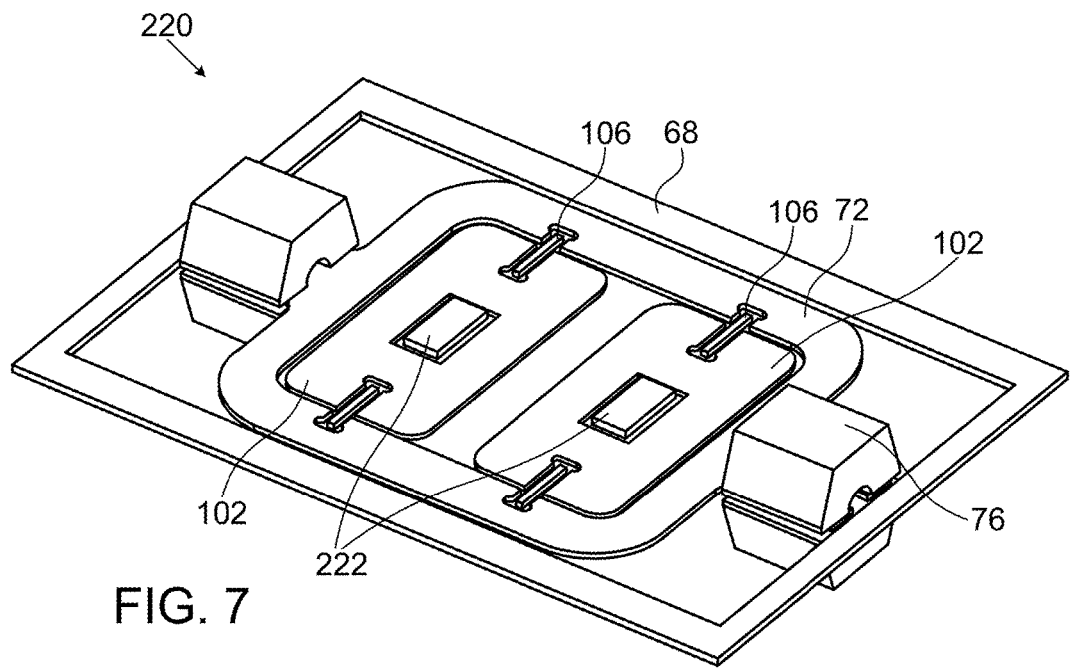
FIG. 7 is a schematic back view of a gimbaled micromirror array, in accordance with an alternative embodiment of the invention.

FIG. 7 is a schematic back view of a gimbaled micromirror array 220, in accordance with an alternative embodiment of the invention. Array 220 may be used in place of array 100 in the embodiments described above. The mechanical elements of array 220 are similar to those in the previous embodiments, and these elements are marked with the same numbers as in the preceding figures.

In array 220, however, in contrast to the preceding embodiments, the coupling means operate by exerting an electromagnetic force between micromirrors 102. For this purpose, the coupling means comprise permanent magnets 222, which are fixed to micromirrors 102, although alternatively, other electrical and/or magnetic elements may be used for this purpose. An electromagnetic force between magnets 222 synchronizes the oscillation of rotating micromirrors 102. This force may comprise a magnetic attraction, which operates in a manner similar to the mechanical elastic force exerted by belts 108. This magnetic attraction creates a force that may be considered equivalent to a spring connected between the micromirrors.

The magnetic force between micromirrors 102 may be adjusted, by appropriate design of array 220, in order to give the desired synchronization properties. This force is a function of factors that include the size and polarity of magnets 222, as well as the distance between them. In addition, the force between magnets 222 will be modulated by the distance of these magnets from and their interaction with magnetic rotors 76 and cores 78, as well as with other magnetically-active elements of the assembly, such as driving currents applied to the magnetic cores.

In other embodiments (not shown in the figures), the coupling means operating between the micromirrors in an array may exert other sorts of electromagnetic forces to synchronize the micromirrors. The term "electromagnetic force" is used in this context in the broad sense, as the term is understood in the physical sciences, to refer to any force that derives from electromagnetic fields. Thus, in addition to attraction and/or repulsion between permanent magnets, the coupling means may use, for example, electrostatic forces between charged bodies or inductive magnetic forces between current-carrying conductors. All such alternative implementations are considered to be within the scope of the present invention.

Figure 8:
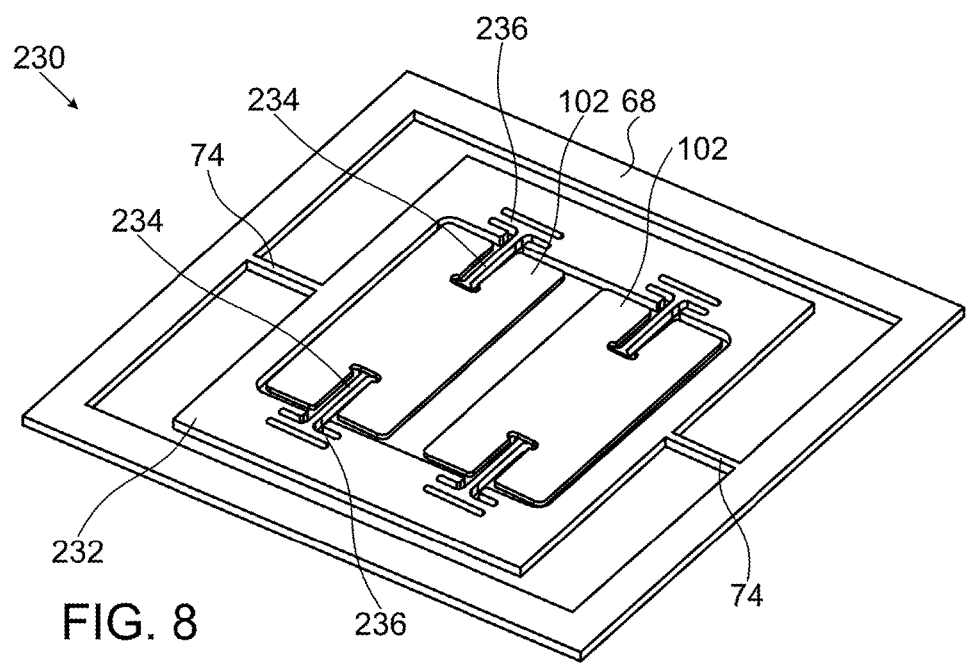
FIG. 8 is a schematic front view of a gimbaled micromirror array, in accordance with another embodiment of the invention.

FIG. 8 is a schematic front view of a gimbaled micromirror array 230, in accordance with another embodiment of the invention. Array 230 may likewise be used in place of array 100 in the embodiments described above. The mechanical elements of array 230 that are closely similar to those in the previous embodiments are marked with the same numbers as in the preceding figures.

Micromirrors 102 in array 230 are connected to a gimbal 232 by hinges 234, which define the axes of rotation of the micromirrors. Gimbal 232 comprises beams 236, to which the ends of hinges 234 are connected. The structure of gimbal 232, including beams 236, is chosen so that the flexible, elastic gimbal itself couples together the motion of micromirrors 102 with a coupling strength sufficient to synchronize their oscillations about their respective axes of rotation. The components of array 230 are designed and etched so as to define a resonant mode of overall oscillation of array 230, including gimbal 232 and micromirrors 102 together, having a quality factor Q sufficiently high so that the micromirrors rotate in synchronization at the resonant frequency.

The incorporation of beams 236 in gimbal 232 is just one example of the sort of flexible gimbal structure that provides the desired coupling, and other structures with similar properties will be apparent to those skilled in the art after reading the present disclosure. Tools and techniques that are known in the art of MEMS design, such as finite-element analysis, may be used to optimize the features of array 230 for the target oscillation frequency and amplitude.

In designing a MEMS system such as array 230, with N micromirrors 102, each micromirror is regarded as an oscillator i with its own resonant frequency $\omega_{i0}$ and quality factor $Q_i$ of oscillation about its hinges. Typically, $$\omega_{i0} = \sqrt{\frac{K_i}{J_i}}$$

wherein $K_i$ is the mechanical stiffness of the hinge, and $J_i$ is the moment of inertia of the micromirror. The individual oscillators (micromirrors) are designed mechanically to rotate with the same amplitude and phase, with resonant frequencies that are close together—although due to manufacturing tolerances, there will nearly always be some difference between the individual resonant frequencies.

Each oscillator i is coupled to each other oscillator j by a mechanical coupling constant $\gamma_{ij}$, which may be positive or negative. Some systems of this sort may be designed with $\gamma_{ij}=1$, in which case the oscillators will be fully synchronized, with the same amplitude, frequency and phase. This sort of design, however, may be difficult or impossible to implement in MEMS micromirror arrays of the type described herein. To maintain low inertia and support oscillation at the individual resonant frequencies of the micromirrors in arrays of the present sort, weak coupling is desirable, meaning that $|\gamma_{ij}| \ll 1$.

This sort of system of loosely-coupled oscillators will have a system resonant frequency $\omega_0$ given by:

$$\omega_0^2 = \frac{1}{N}\sum_{k=1}^{N}\omega_{k0}^2$$

and an overall quality factor Q given by:

$$\frac{1}{Q} = \sum \frac{1}{Q_i}.$$

In order that all the micromirrors oscillate together reliably at the system resonant frequency $\omega_0$, without substantial damping, it is necessary that the overall Q-factor of the common resonant mode be high enough and the coupling between the micromirrors be strong enough to overcome the differences between the individual resonant frequencies $\omega_{i0}$ and the system frequency $\omega_0$. The Q-factor and coupling strengths should also be high enough to separate the desired common resonant mode from other system modes, which might otherwise have a parasitic effect.

The above conditions can be expressed by the following relation, to be satisfied for each of the micromirrors i:

$$\frac{\Delta\omega_{i0}}{\omega_0} < \frac{1}{Q} \ll |\gamma_i| \ll 1$$

wherein $|\gamma_i|=\max\{|\gamma_{ij}|, j=1,N\}$. For the case of an array of two micromirrors, as in array 230, this relation becomes:

$$\frac{\Delta\omega_{12}}{\omega_0} < \frac{1}{Q} \ll |\gamma| \ll 1$$

wherein $\Delta\omega_{12}=\omega_{10}-\omega_{20}$ is the difference between the individual eigenfrequencies of the two micromirrors, and $\gamma \equiv \gamma_{12}$. In this case, choosing $\gamma$ to be positive corresponds to the mode in which a static torque moment applied to one micromirror results in rotation of both micromirrors about their axes in phase, so that the rotating micromirrors have the same angular orientation during oscillation. When $\gamma$ is negative, a static torque moment applied to one micromirror leads to rotation of the other micromirror in the opposite direction, meaning that the micromirrors rotate in anti-phase.

The requirement that $$\frac{\Delta\omega_{12}}{\omega_0} < \frac{1}{Q}$$

can be relaxed at the expense of damping of the common oscillation mode, so that the mode is broadened enough to overcome the frequency separation $\Delta\omega_{12}$. In this case, the system resonance is damped by a factor Q/q, wherein $q=\omega_0/\Delta\omega_{12}$, meaning that more external energy is required in order to maintain a given oscillation amplitude.

Although the operation of micromirror arrays 100, 220 and 230 is described above primarily in the context of optical head 40 and 3D mapping, the principles of these arrays may similarly be applied in optical scanners of other types, for substantially any application requiring a compact, high-frequency resonant scanner. Such scanners may be driven magnetically, as in the embodiments described above, or using any other suitable sort of drive mechanism that is known in the art, including various types of magnetic and electrostatic drives, for example. Furthermore, as noted earlier, the mirrors may be coupled and driven so that while rotating at the same frequency, the mirrors are oriented at different angles during their respective scans. This latter mode of operation can be useful in synchronized multi-beam scanning systems. Although the rotating members in arrays 100, 220 and 230 are coated so as to serve as mirrors, such coating is not an essential part of the present invention, and the principles described herein may similarly be applied in creating arrays of rotating members for other purposes.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A scanning device, comprising a substrate, which is etched to define:
   an array of two or more parallel rotating members;
   a gimbal surrounding the rotating members;
   first hinges, connecting the gimbal to the substrate and defining a first axis of rotation, about which the gimbal rotates relative to the substrate; and
   second hinges connecting the rotating members to the gimbal and defining respective second, mutually-parallel axes of rotation of the rotating members relative to the gimbal, which are not parallel to the first axis,
   wherein the gimbal is configured to couple together the two or more parallel rotating members with a coupling strength sufficient to synchronize an oscillation of the rotating members at a common resonant frequency about the respective second axes, and
   wherein the rotating members, gimbal and hinges are etched so as to define a resonant mode of the oscillation having a quality factor Q, such the quality factor Q and the coupling strength $\gamma$ satisfy the relation: $1/Q \ll |\gamma| \ll 1$.

2. The device according to claim 1, wherein the mode of oscillation is defined so that $\gamma > 0$, and the rotating members rotate in phase about the respective second axes.

3. The device according to claim 1, wherein the rotating members comprise plates, and the device comprises a reflective coating applied to the substrate on the plates, whereby the plates function as micromirrors.

4. The device according to claim 1, wherein the substrate is a part of a silicon wafer.

5. The device according to claim 1, and comprising an electromagnetic drive, which is coupled to drive the gimbal and the rotating members to rotate respectively about the first and second axes.

* * * * *